United States Patent
Niepmann et al.

(10) Patent No.: US 6,327,155 B1
(45) Date of Patent: Dec. 4, 2001

(54) METHOD AND APPARATUS FOR PREVENTING FLAMESPREAD IN AN EQUIPMENT ASSEMBLY

(75) Inventors: Mark Jeffrey Niepmann, Suwanee; Eric Hoyt Wong, Alpharetta; Edward R. Champion, Jr., Kennesaw, all of GA (US)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/465,477

(22) Filed: Dec. 16, 1999

(51) Int. Cl.[7] .............................. H05K 5/02; H05K 5/03
(52) U.S. Cl. ..................... 361/757; 361/752; 361/758; 361/796; 361/797; 361/800; 361/816
(58) Field of Search .................... 361/728, 732, 361/740, 741, 747, 756, 757, 800–802, 736, 742, 758, 787, 769, 770, 797, 804, 752, 753, 754, 759, 784, 796, 816, 818, 685–686

(56) References Cited

U.S. PATENT DOCUMENTS

| | | |
|---|---|---|
| 4,499,523 * | 2/1985 | Gillett et al. ................... 361/757 |
| 4,997,702 | 3/1991 | Gazit et al. . |
| 5,006,411 * | 4/1991 | Motonari et al. ................ 428/421 |
| 5,229,192 | 7/1993 | Kober et al. . |
| 5,335,147 * | 8/1994 | Weber .............................. 361/818 |
| 5,466,728 | 11/1995 | Babcock et al. . |
| 5,498,471 | 3/1996 | Hausdorf et al. . |
| 5,552,209 | 9/1996 | McCutcheon . |
| 5,617,296 * | 4/1997 | Melville et al. ................. 361/736 |
| 5,692,297 * | 12/1997 | Noda ................................. 29/845 |

* cited by examiner

Primary Examiner—Jayprakash N. Gandhi
Assistant Examiner—John B. Vigushin

(57) ABSTRACT

A printed circuit card assembly for preventing flame spread in an equipment assembly includes a printed circuit board having first and second sides, at least one of the first and second sides of the printed circuit board adapted for mounting a plurality of electronic components thereon; and a heat absorbing flame resistant shield facing one side of the printed circuit board for absorbing heat energy from an adjacent printed circuit card assembly thereby reducing heat transfer to the printed circuit board.

28 Claims, 5 Drawing Sheets

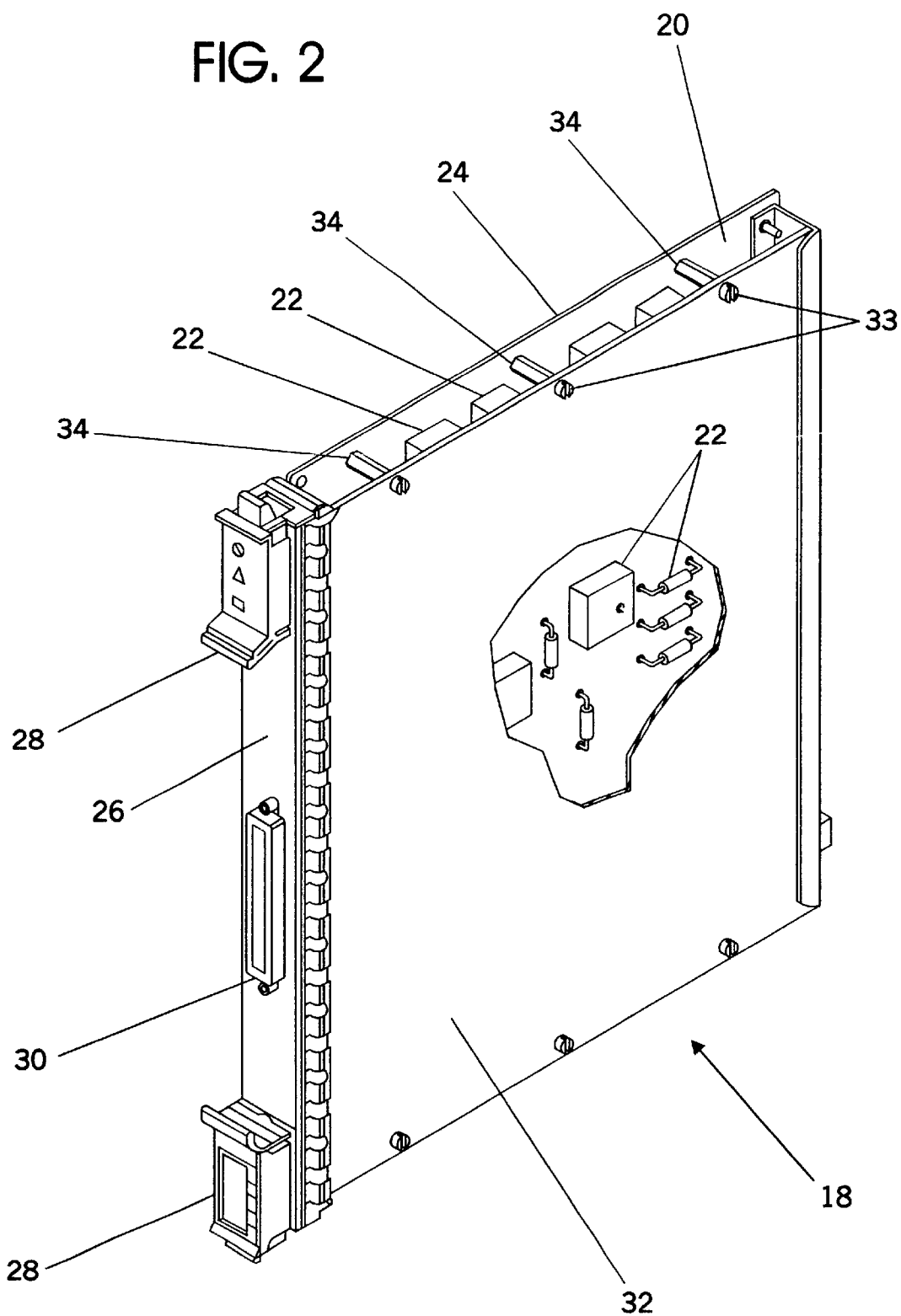

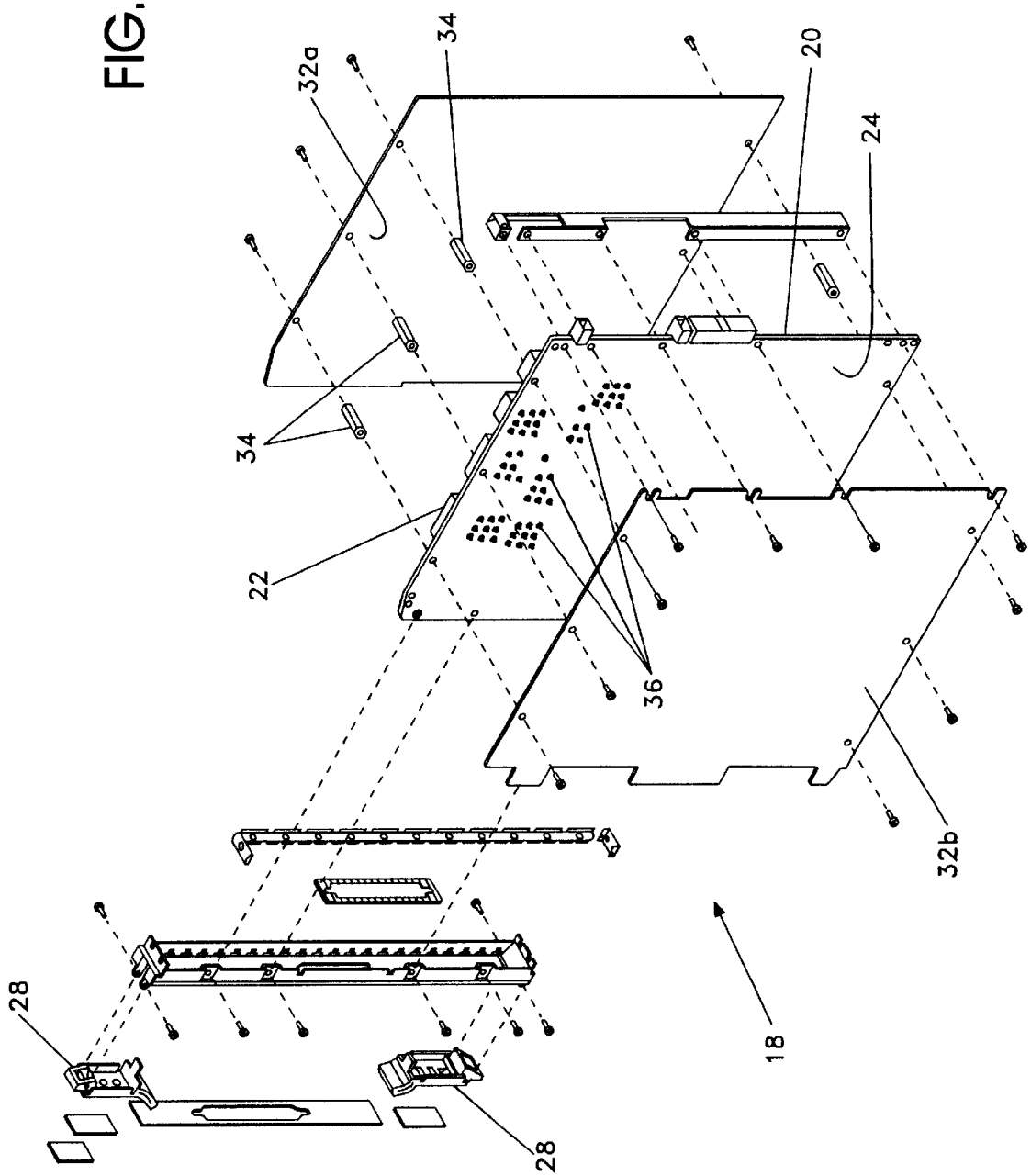

METHOD AND APPARATUS FOR PREVENTING FLAMESPREAD IN AN EQUIPMENT ASSEMBLY

TECHNICAL FIELD

This invention relates generally to electronic equipment assemblies, and more particularly, to a printed circuit card assembly and system for preventing flame spread through an electronic equipment assembly.

BACKGROUND ART

Electronic equipment assemblies such as, for example, telecommunications equipment, generally comprise a cabinet that houses a number of printed circuit card assemblies within one or more shelves. Each printed circuit card assembly includes a printed circuit board with electronic components mounted thereon. In order to reduce equipment size, manufacturers must make maximum use of the space available on the printed circuit boards of the printed circuit card assemblies that comprise the electronic equipment assembly by increasing component density on each printed circuit board. Because a majority of the components found on the printed circuit boards are made of plastic or similar combustible material, the fuel load carried by each printed circuit card assembly within an electronic equipment assembly has increased tremendously. Moreover, these component-dense printed circuit card assemblies are inserted into the shelves of the electronic equipment assemblies at a tight card-to-card pitch in order to further reduce the size of the electronic equipment assembly. This decreased spacing between printed circuit card assemblies allows for an increased number of card assemblies per shelf/system and thus increases the amount of heat generated by the shelf/system, thereby increasing the risk of fire, and increasing the likelihood of adjacent printed circuit card assemblies igniting each other should one printed circuit card assembly catch fire.

Accordingly, flame spread through an electronic equipment assembly has become of great concern given these increased fuel loads resulting from increased component density on the printed circuit card assembly and increased printed circuit card assembly density within the shelves of the equipment.

Consider, for example, a telecommunications switching point that controls a regional calling area that might contain several electronic equipment assemblies. Should one printed circuit card assembly of one electronic equipment assembly catch fire, and that fire spreads unchecked through the electronic equipment assembly, the fire is likely to spread beyond that assembly to other electronic equipment assemblies resulting in loss of millions of dollars in telecommunications equipment, loss of telephone service for that area, as well as possible loss of life. As a result, guidelines that permit manufacturers to sell such electronic equipment assemblies have become increasingly more stringent.

In particular, GR-63-CORE, issued Oct. 1, 1995, sets forth the Telcordia (previously Bellcore)/NEBS standard which requires that all equipment assemblies pass a flame spread test based on the American National Standards Institute (ANSI) standard for fire propagation hazard testing in telecommunication equipment. The test requires that a burner be ignited and then placed within the electronic equipment assembly.

Specifically, sections 4.2.2 and 5.2.3 of GR-63-CORE, issued Oct. 1, 1995, call for a programmable methane line burner to be ignited and inserted into the equipment assembly at a location where it is anticipated that fire spread is most likely to occur. The burner is inserted into the vacated space created by removing one printed circuit card assembly from the shelf under test. The burner is ignited and a flow of methane is held at one liter per minute (l/m) for ten seconds. The flow is increased linearly to nine l/m during the next eighty seconds of the test at which point the flow is decreased linearly back to zero point zero one l/m during the following two-hundred-forty seconds. At this point, three-hundred-thirty seconds into the test, the burner is turned off and observations are made and recorded as to whether or not the fire is self-sustaining and whether or not there is a continued presence of observable smoke. Smoke, gas, temperature and heat release measurements are recorded throughout the test.

During the first ninety seconds of the GR-63-CORE test, a significant amount of heat is released in the burn area of the printed circuit board of the printed circuit card assembly, that is, the area on the printed circuit board that is most likely to catch fire. The principal modes of heat transfer are radiation and convection. Unprotected boards typically result in the components igniting during this first ninety seconds of the test. Moreover, these components can burn for up to and even beyond five and one half minutes of methane flow.

The current solution to meeting the flame spread test given the current, component-dense printed circuit card assemblies is to increase the printed circuit card assembly pitch in the electronic equipment assembly to provide more space between adjacent printed circuit card assemblies, or else to decrease the fuel load on the printed circuit card assemblies by reducing the number of components per printed circuit board (which requires more printed circuit card assemblies per electronic equipment assembly). Both of these solutions, however, result in undesirable increases in equipment assembly size.

DISCLOSURE OF THE INVENTION

This invention results from the realization that a truly effective printed circuit card assembly for preventing flame spread through an equipment assembly can be realized by providing at least one sacrificial heat absorbing flame resistant shield adjacent to and facing at least one side of the printed circuit board of the printed circuit card assembly. The flame resistant shield absorbs heat energy from an adjacent printed circuit card assembly which would otherwise be directed at the printed circuit board, thereby preventing heat transfer to the printed circuit board and the components mounted thereon so as to prevent ignition of the components.

The present invention features a printed circuit card assembly for preventing flame spread in an electronic equipment assembly. There is generally provided a printed circuit board having first and second sides, at least one of the first and second sides of the printed circuit board adapted for mounting a plurality of electronic components thereon. A sacrificial heat absorbing flame resistant shield is provided facing at least one of the first and second sides of the printed circuit board for absorbing heat energy, thereby reducing heat transfer to the printed circuit board from an adjacent printed circuit card assembly and preventing the electronic components from igniting.

The printed circuit card assembly can include a face plate disposed along an edge of the printed circuit board. There can also be a second flame resistant shield facing the other of the first and second sides of the printed circuit board. The flame resistant shield can include a sheet of synthetic aramid polyamide flame resistant fiber or a sheet of synthetic aromatic polyimide flame resistant film for absorbing heat energy. The flame resistant shield can face the component side of the printed circuit board. The flame resistant shield can be a laminate structure and can include an inner layer, an outer layer and an intermediate layer between the inner layer and outer layer. The inner layer and the outer layer can be a polyamide sheet such as NOMEX® calendered sheet and the intermediate layer can be a polyimide film such as KAPTON®, or the intermediate layer can include aluminum sheet metal.

The present invention also features a printed circuit card assembly for preventing flame spread in an equipment assembly including a printed circuit board having first and second sides, at least one of the first and second sides of the printed circuit board adapted for mounting a plurality of electronic components thereon. A first flame resistant shield faces the first side of the printed circuit board and a second flame resistant shield faces the second side of the printed circuit board, the first and second flame resistant shields absorbing heat energy from an adjacent printed circuit card assembly thereby reducing heat transfer to the printed circuit board for preventing the components on the printed circuit board from igniting.

The present invention further features a system for preventing flame spread in an electronic equipment assembly. There is a plurality of adjacent printed circuit card assemblies. Each printed circuit card assembly includes a printed circuit board having first and second sides, at least one of the first and second sides of the printed circuit board adapted for mounting a plurality of electronic components thereon and a sacrificial heat absorbing flame resistant shield facing one of the first and second sides of the printed circuit board. The shield absorbs heat energy from an adjacent printed circuit card assembly thereby reducing heat transfer from the adjacent printed circuit card assembly to the printed circuit board for preventing the components thereon from igniting.

The invention features still further a method for preventing fire spread through an electronic assembly including a plurality of adjacent printed circuit card assemblies by placing between adjacent printed circuit card assemblies (wherein each printed circuit card assembly includes a printed circuit board with electronic components mounted thereon) a sacrificial flame resistant shield for absorbing heat energy from an adjacent printed circuit card assembly. This serves to reduce heat transfer to the printed circuit board for preventing the components thereon from igniting.

Therefore, it is an object of the present invention to provide a novel printed circuit card assembly for preventing flame spread in an equipment assembly.

This and other objects are achieved, in whole or in part, by the present invention. While some of the objects of the invention have been stated hereinabove, other objects will become evident as the description proceeds when taken in connection with the accompanying drawings as best described hereinbelow.

BRIEF DESCRIPTION OF THE DRAWINGS

FIG. 2 is a perspective view, with parts broken away for clarity, of a flame retardant printed circuit card assembly according to the present invention including a printed circuit board and a flame resistant shield facing the component side of the printed circuit board;

FIG. 4 is an exploded perspective view of a flame retardant printed circuit card assembly according to the present invention including two sacrificial flame resistant shields wherein one faces the component side and one faces the lead side of the printed circuit board;

DETAIL DESCRIPTION OF THE INVENTION

As discussed above, state-of-the-art multi-circuit printed circuit card assemblies have a massive fuel load present in the plastic packages of the relays and other components mounted on the printed circuit boards and thus can present a significant fire threat.

Figure 1:
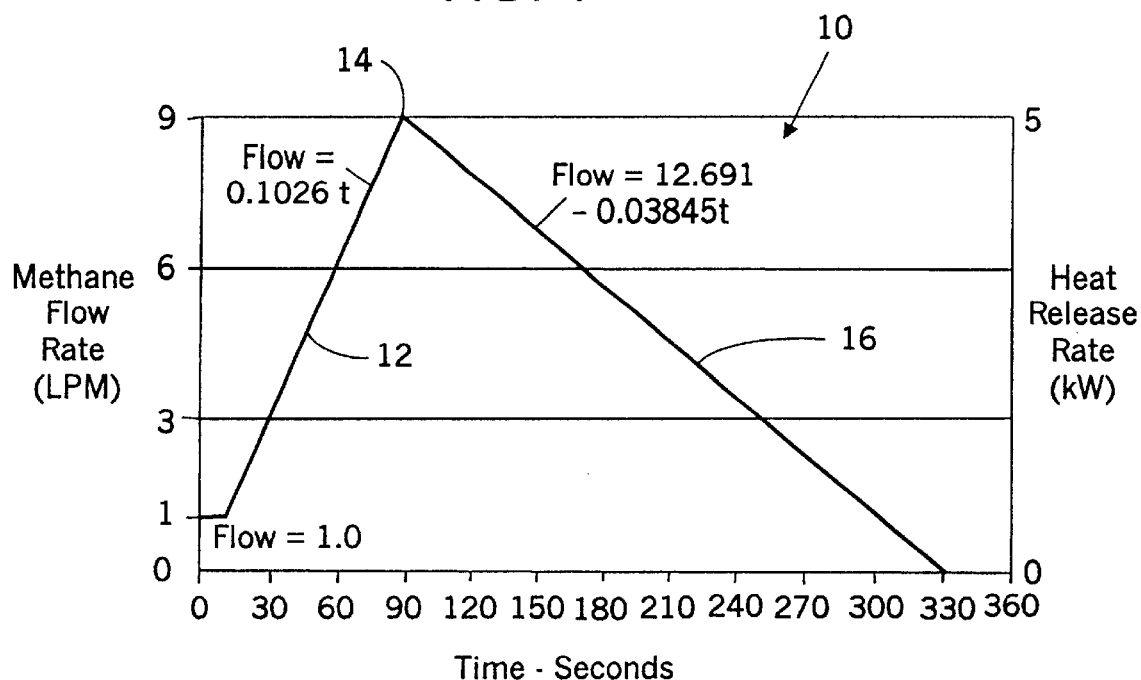
FIG. 1 is a graphical representation of the rate of methane gas flow according to the Telcordia/NEBS GR-63-CORE flame spread test.

The burn profile for the GR-63-CORE flame spread test is represented by the curve, generally designated 10, in FIG. 1 which is a representation of the burner gas flow rate over time. The burn profile is intended to simulate a burning printed circuit card assembly. As demonstrated by linear portion 12, the greatest heat transfer occurs during the first ninety seconds of the test where the flow rate peaks 14 at nine l/m. The maximum amount of heat which the adjacent printed circuit card assemblies are subjected to is approximately 5000 watts.

Thereafter, the flow rate decreases linearly over the remaining two-hundred-forty seconds, as demonstrated by linear portion 16, to zero point zero one (0.01) l/m. Burn profile 10 is thus intended to simulate the amount of heat that adjacent printed circuit card assemblies can be exposed to if an intermediate card were to catch fire. Thus, as the plastic ignites, the heat from the flames is greatest during the first ninety seconds which is the critical time period during which flame spread is most likely to occur as the heat is transferred to the components of the adjacent card assemblies. As a result, this time period is the critical time period during which adjacent printed circuit card assemblies must resist heat.

The printed circuit card assembly, generally designated 18 in FIG. 2, according to one embodiment of the present invention prevents flame spread through an equipment assembly. Printed circuit card assembly 18 includes a printed circuit board 20 upon which are mounted a plurality of components 22 such as relays, resistors, integrated circuits, typically at a high density, that result in an increased fuel load. The opposite side of printed circuit board 20 can also include components. The opposite or lead side 24 of printed circuit board 20 can also comprise the leads of components 22 (as shown in FIG. 3) which are soldered in place to secure components 22 to printed circuit board 20.

Figure 3:
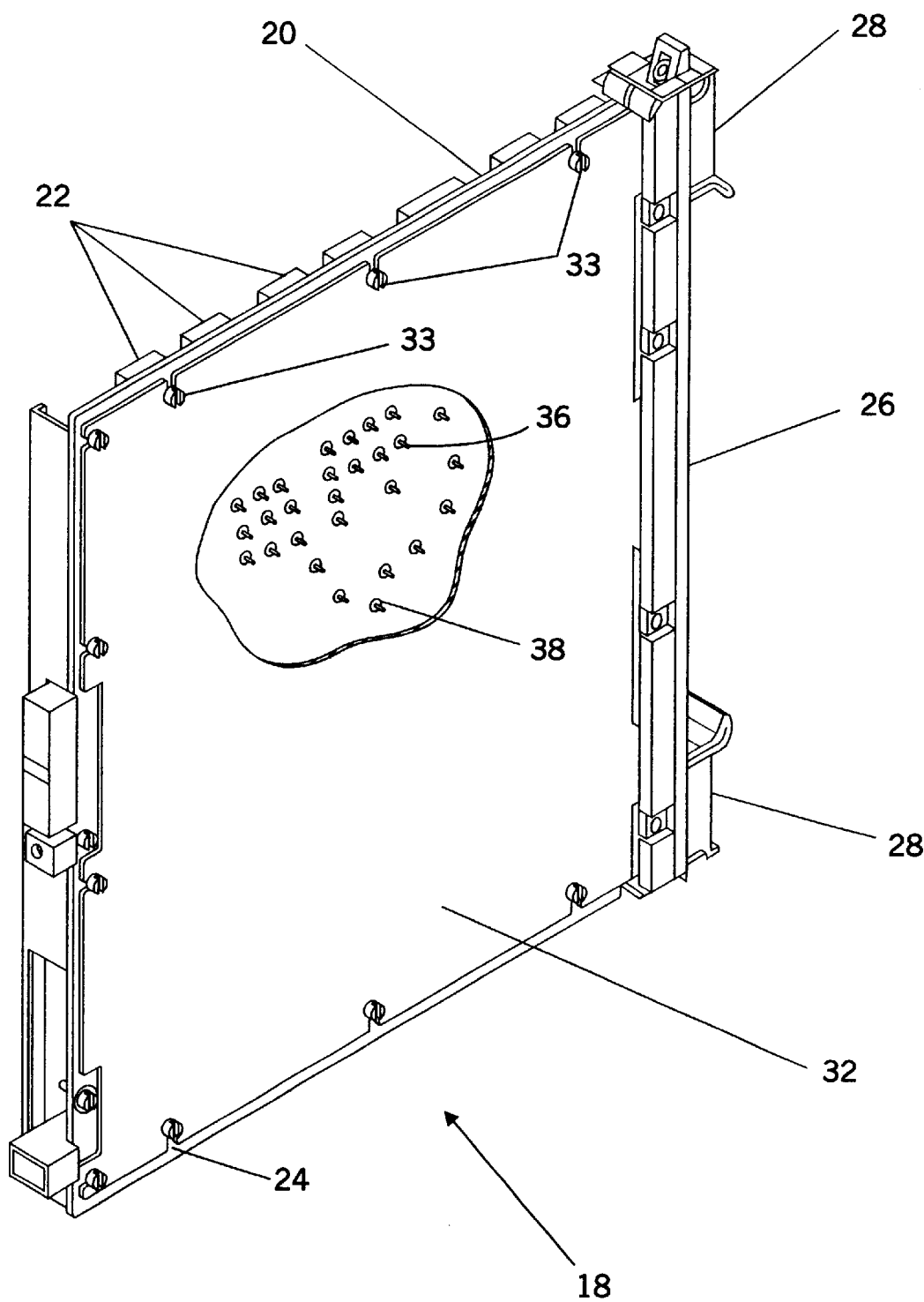
FIG. 3 is a perspective view similar to FIG. 2 in which a flame shield is facing the lead side of the printed circuit board.

Although printed circuit card assembly 18 illustrated in FIGS. 2 and 3 includes a printed circuit board 20 having pin-through hole components mounted thereon, the present invention is not limited to printed circuit boards with pin-through-hole components, since printed circuit card assembly 18 can also include surface mount components or a combination of both.

Printed circuit card assembly 18 typically includes a face plate 26 along an edge of printed circuit board 20. Face plate 26 generally comprises locking tabs 28, which secure printed circuit card assembly 18 within an equipment assembly. Face plate 26 also provides electromagnetic interference shielding to/from printed circuit card assembly 18 and the environment. Face plate 26 may also include an electrical interface 30 which establishes an electrical connection between printed circuit card assembly 18 and other printed circuit card assemblies (not shown). Face plate 26 further serves to prevent flames from migrating outside the shelf should printed circuit card assembly 18 catch fire as well as maintaining an air flow path by maintaining a chimney through a shelf. However, face plate 26 is application dependent and may not be present and thus should not be considered a limitation of the subject invention.

In order to prevent flame spread, sacrificial flame resistant shield 32 is provided to absorb heat generated by components 22 should they ignite, or by components which have ignited on adjacent printed circuit card assemblies by converting the heat energy and reducing heat transfer. Because shield 32 is heat absorbing, shield 32 can also assist in preventing ignition caused by over-heated components by absorbing heat generated by components 22 through normal operation of printed circuit card assembly 18.

In the event an adjacent printed circuit card assembly has ignited, sacrificial flame resistant shield 32 absorbs radiated heat from the adjacent printed circuit card assembly, so as to significantly reduce the heat transferred to components 22 of printed circuit card assembly 18 and prevent components 22 from reaching ignition temperature. In the event components 22 of printed circuit card assembly 18 have ignited, sacrificial flame resistant shield 32 absorbs heat from the ignited components and significantly reduces the amount of heat radiated to adjacent printed circuit card assemblies (not shown). Sacrificial flame resistant shield 32 absorbs the heat and through energy conversion typically is reduced to a charred state.

In a preferred embodiment, sacrificial flame resistant shield 32 comprises a flame resistant, high temperature, synthetic aromatic polyamide polymer sheet which has exceptional thermal stability. One such example is NOMEX® aramid calendered paper, available from E.I. DuPont de Nemours and Company (DuPont), Wilmington, Del., which is formed of floc (short fibers that provide mechanical strength), or fibrid (microscopic filmy particles) that provide dielectric strength and act as a binder. The flocs and fibrids are combined to form sheet structures. The fibrids join to form filmy webs between the fibers. In most cases, the paper sheet is then densified, or calendered, at high temperature and pressure to permanently lock the components together and produce a relatively impermeable structure with high levels of electrical and mechanical integrity. However, NOMEX® paper is not a necessary limitation of the invention, as other flame resistant sheets have also been found to be effective in preventing flame spread.

Examples, rather than limitations, of materials also found to be effective in preventing flame spread include a flame resistant, aromatic polyimide film such as KAPTON®, also available from DuPont and described in Bulletin GS96-7 which is incorporated herein by reference. KAPTON® is a tough, aromatic polyimide film that exhibits an excellent balance of physical, chemical, and electrical properties over a wide temperature range, particularly at unusually high temperatures. Chemically, the polyimide polymer makeup is the result of a polycondensation reaction between pyromellitic dianhydride and diaminodiphenyl ether. Another polyimide film is IMIDEX®, available from Westlake Plastics Company of Lenni, Pa. Laminate sheets of NOMEX®-kAPTON®-NOMEX® and laminates sheets of NOMEX®-sheet metal-NOMEX® have also been found to be effective in preventing flame spread.

Ceramic fiber papers and woven fabrics under the NEXTEL® brand available from Minnesota Mining and Manufacturing Company (3M) of St. Paul, Minn., have been successfully tested as well. NEXTEL® ceramic fibers are refractory aluminoborosilicate (312 & 440), aluminosilica (550 & 720), and alumina (610) fibers with diameters ranging from 7–13 microns. NEXTEL® 312 ceramic fibers and NEXTEL®440 ceramic fibers are continuous polycrystalline metal oxide fibers. NEXTEL® 312 nonwoven paper includes a high temperature inorganic binder and is designed for fire barrier applications. These papers utilize the same fibers as NEXTEL® 312 fabrics which have passed the FAR Parts 23 and 25 (2000° F. 15 minute firewall tests), and which are engineered to be used as jet engine fire blankets on many commercial aircraft. Inorganic content high-performance paper composed of glass fibers and micro fibers, inorganic fillers and organic binders also provide suitable shielding in the present invention. Examples are, such as CeQUIN®_I, CeQUIN®_II, CeQUIN®_3000, CeQUIN®_3000-glass fabric laminate, TufQUIN®, CeQUINBORD®_CGA, and GARDBORD® available from QUIN-T Corporation of Tilton, N.H. CeQUIN®_I is a high inorganic-content paper composed primarily of glass fibers and microfibers, inorganic fillers, and less than 10% organic binder. CeQUIN®_I is capable of long-term performance at operating temperatures up to 250° C. CeQUIN®_II is a two-layer composite of CeQUIN®_I designed to provide thicker roll stock for barrier, end filler, and core wrap insulation applications and exhibits enhanced physical and dielectric properties.

Sacrificial flame resistant shield 32, when facing the component side of printed circuit board 20, can be spaced from printed circuit board using spacers 34. Spacers 34 are typically of a length that allow shield 32 to reside along the sky line of components 22 and typically without contacting components 22. However, contact between shield 32 and components 22 can occur without adversely affecting the flame spread prevention provided by the present invention. Screws 33 are used to fasten shield 32 to spacers 34. However, other means of fastening will be readily apparent to those skilled in the art. Moreover, fastening of shield 32 is not a necessary limitation of the invention as flame resistant shield 32 need not be physically attached to printed circuit card assembly 18, but need merely be placed in close proximity to printed circuit card assembly 18. Thus, sacrificial flame resistant shield 32 could be placed between adjacent printed circuit card assemblies, and not physically attached to either printed circuit card assembly, without departing from the spirit and scope of the present invention and still prevent flame spread to adjacent printed circuit card assemblies.

It has been found that shield 32 not only absorbs heat to prevent component ignition, but also acts as a channel for cooling air flow and has been shown to improve cooling of components 22 by a full degree or more. The temperature of a printed circuit card assembly without shield 32 was measured to average approximately 36° C. compared to a printed circuit card assembly with shield 32 which measured an average temperature of approximately 31° C.

The dimensions of sacrificial shield 32 can be the same as the dimensions of printed circuit board 20 in order to prevent flames from migrating around the edges of shield 32. The thickness of sacrificial flame resistant shield 32 is a function of the particular fuel load carried by printed circuit board 20 as well as the printed circuit card assembly pitch within the equipment assembly. Thus, where the fuel load is greater, more heat must be absorbed in order to provide the requisite time during which printed circuit card assembly 18 must resist heat from an adjacent printed circuit card assembly to prevent components 22 on printed circuit card assembly 18 from igniting. Sacrificial shield 32 should exhibit sufficient structural stability to resist punctures, but, shield 32 must also remain thin enough that the pitch of printed circuit card assembly 18 is not exceeded.

Referring to FIG. 3, it will be apparent that sacrificial shield 32 can also face lead side 24 of printed circuit board 20. In this configuration shield 32 prevents heat from an adjacent board from melting the solder joint between lead 36 and printed circuit board 20. This occurrence would otherwise cause some or all of components 22 to fall or be displaced from printed circuit board 20 and thus permit flames to enter through lead holes 38 in printed circuit board 20 and directly ignite components 22.

In another embodiment printed circuit card assembly 18, as shown in FIG. 4, includes a first sacrificial flame resistant shield 32a made of NOMEX® aramid fiber calendered paper facing components 22 on printed circuit board 20 and a second sacrificial flame resistant shield 32b of NOMEX® aramid fiber calendered paper facing lead side 24 of printed circuit board 20. The thickness of sacrificial shield 32b is a function of the lead length protruding from printed circuit board 20 to prevent leads 36 from puncturing sacrificial flame resistant shield 32b.

Figure 5:
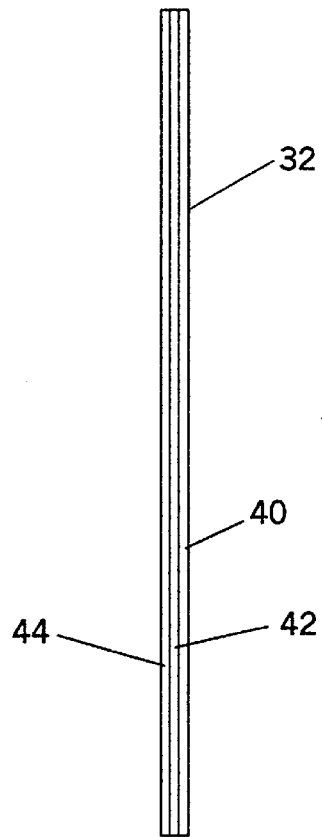
FIG. 5 is a vertical cross-sectional view of a sacrificial flame resistant shield having a laminate structure.

Sacrificial shield 32, as shown in FIG. 5, comprises an outer layer 40, an intermediate layer 42 and an inner layer 44. Outer layer 40 and inner layer 44 include 0.005 inch thick sheets of 410 NOMEX® and intermediate layer 42 includes a 0.005 inch thick sheet of KAPTON®. A high temperature adhesive can be used to laminate outer layer 40 and inner layer 44 to intermediate layer 42. Because NOMEX® is a hygroscopic material, it can become warped and distorted as it expands and contracts due to moisture absorption. Intermediate layer 42 prevents shield 32 from becoming distorted by providing dimensional stability to shield 32 such that printed circuit card assembly 18 can be easily extracted and inserted without risk of damaging shield 32. It has further been found that NOMEX® also absorbs environmental gases and contaminants which would otherwise deposit on printed circuit board 20, and thus increases the longevity and reliability of components 22 and printed circuit card assembly 18.

In an alternate embodiment, intermediate layer 42 can be sheet metal such as, for example, aluminum, in lieu of KAPTON® to provide dimensional stability.

Figure 6:
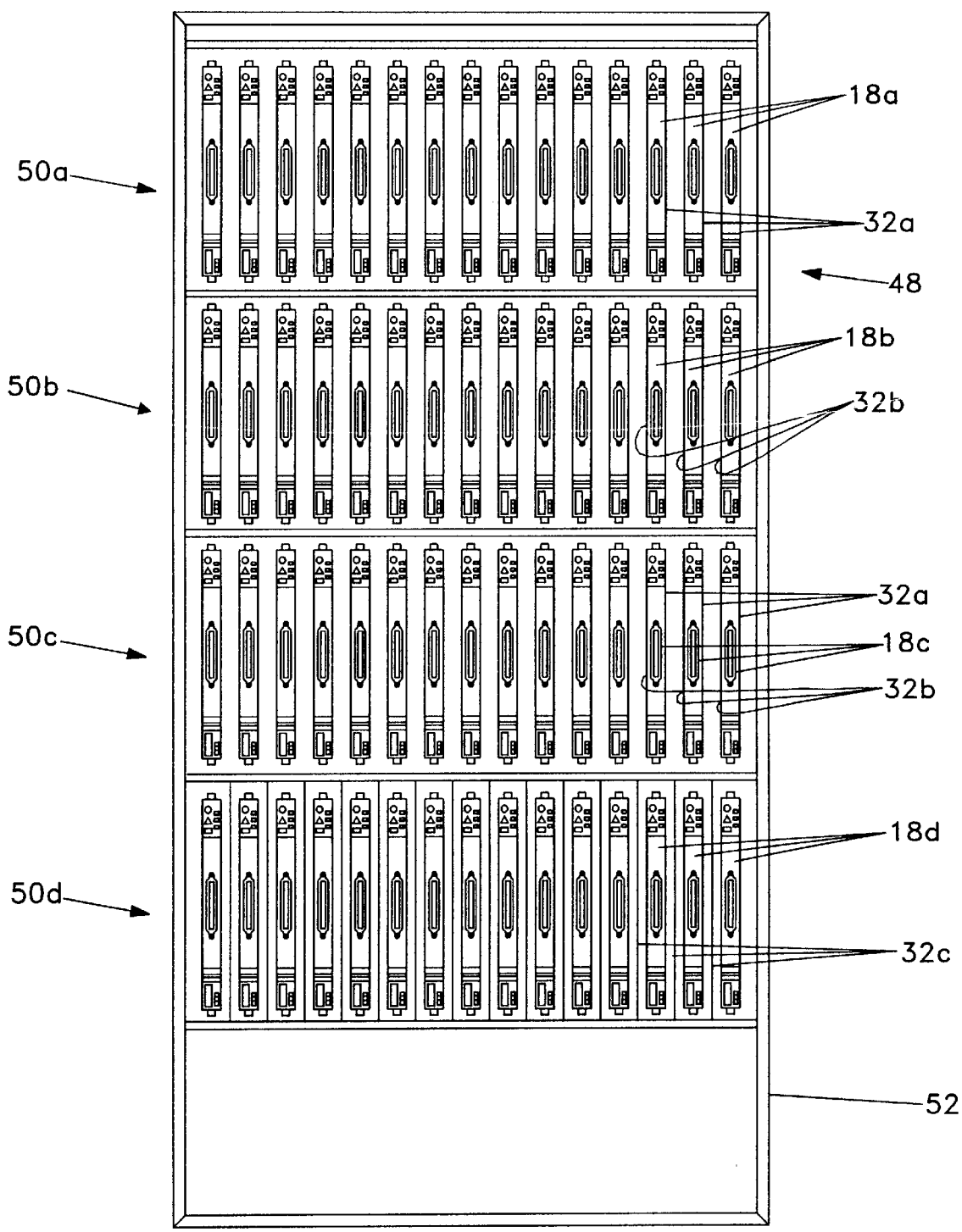
FIG. 6 is a schematic view of a system for preventing flame spread through an electronic equipment assembly including a plurality of flame retardant printed circuit card assemblies according to the present invention.

Referring now to FIG. 6, there is provided a system for preventing flame spread through an equipment assembly, generally designated 48, in which a plurality of printed circuit card assemblies 18a–18d are arranged in adjacent relationship along each of shelves 50a–50d, respectively, within cabinet 52. There is associated with each printed circuit card assembly 18a a sacrificial flame resistant shield 32a, as shown on shelf 50a, and described above with reference to FIG. 2. Therefore, should one of printed circuit card assemblies 18a catch fire, shields 32a prevent flame spread from adjacent printed circuit card assemblies 18a and thus prevent flame spread through equipment assembly 48.

Alternatively, there may be associated with each printed circuit card assembly 18b a sacrificial shield 32b, as shown on shelf 50b and as described above with reference to FIG. 3. The system can further embody sacrificial shields 32a and 32b associated with each printed circuit card assembly 18c, as shown on shelf 50c and as described above in reference to FIG. 4. In yet another embodiment, there can be associated with each printed circuit card assembly 18d a sacrificial shield 32c placed between adjacent printed circuit card assemblies 18d, as shown on shelf 50d. Sacrificial shield 32c prevents flame spread through assembly 48 by preventing flame spread to adjacent printed circuit card assemblies 18d.

Thus, the present invention effectively prevents flame spread through an electronic equipment assembly by placing a sacrificial, heat absorbing flame resistant shield facing at least one side of a printed circuit board of a printed circuit card assembly. The sacrificial shield absorbs heat energy from an adjacent printed circuit card assembly, so as to reduce the transfer of heat from the adjacent printed circuit card assembly to the components of the printed circuit board and to prevent the components from igniting.

Although specific features of this invention are shown in some drawings and not others, this is for convenience only, as each feature may be combined with any or all of the other features in accordance with the invention. It will be understood that various details of the invention may be changed without departing from the scope of the invention. Furthermore, the foregoing description is for the purpose of illustration only, and not for the purpose of limitation—the invention being defined by the claims.

What is claimed is:

1. A printed circuit card assembly for preventing flame spread in an equipment assembly, the printed circuit card assembly comprising:

(a) a printed circuit board having first and second sides, at least one of the first and second sides adapted for mounting a plurality of electronic components thereon; and (b) a flame resistant shield spaced from and facing at least one of the first and second sides of the printed circuit board for absorbing and converting heat energy from an adjacent printed circuit card assembly and for reducing heat transfer to the printed circuit board.

2. The printed circuit card assembly of claim 1 further including a face plate disposed along an edge of the printed circuit board.

3. The printed circuit card assembly of claim 1 further comprising a second flame resistant shield facing the other of the first and second sides of the printed circuit board.

4. The printed circuit card assembly of claim 1 in which the flame resistant shield comprises a sheet of synthetic aramid polyamide flame resistant fiber for absorbing heat energy.

5. The printed circuit card assembly of claim 1 in which the flame resistant shield comprises a sheet of synthetic aromatic polyimide flame resistant film for absorbing heat energy.

6. The printed circuit card assembly of claim 1 in which the flame resistant shield faces components mounted on the printed circuit board.

7. The printed circuit card assembly of claim 1 in which the flame resistant shield comprises a laminate structure.

8. The printed circuit card assembly of claim 7 in which the laminate structure includes an outer layer and an inner layer with an intermediate layer therebetween.

9. The printed circuit card assembly of claim 8 in which the outer layer and the inner layer comprise a polyamide sheet and the intermediate layer comprises a polyimide film.

10. The printed circuit card assembly of claim 8 in which the outer layer and the inner layer comprise a polyamide sheet and the intermediate layer comprises aluminum sheet metal.

11. A printed circuit card assembly for preventing flame spread in an equipment assembly, the printed circuit card assembly comprising:
  (a) a printed circuit board having first and second sides, at least one of the first and second sides adapted for mounting a plurality of electronic components thereon;
  (b) a face plate disposed along an edge of the printed circuit board for retaining the printed circuit board within an equipment assembly;
  (c) a first flame resistant shield spaced from and facing the first side of the printed circuit board; and
  (d) a second flame resistant shield spaced from and facing the second side of the printed circuit board, the first and second flame resistant shields for absorbing and converting heat energy from an adjacent printed circuit card and for reducing heat transfer to the printed circuit board.

12. A system for preventing flame spread in an equipment assembly comprising:
  a plurality of adjacent printed circuit card assemblies, each printed circuit card assembly comprising;
    (i) a printed circuit board having first and second sides, at least one of the first and second sides adapted for mounting a plurality of electronic components thereon;
    (ii) a flame resistant shield spaced from and facing one of the first and second sides of the printed circuit board for absorbing and converting heat energy from an adjacent printed circuit card assembly and for reducing heat transfer to the printed circuit board.

13. The system of claim 12 in which each printed circuit card assembly further comprises a face plate disposed along an edge of the printed circuit board.

14. The system of claim 12 in which each printed circuit card assembly further comprises a second flame resistant shield facing the other of the first and second sides of the printed circuit board.

15. The system of claim 12 in which each flame resistant shield comprises a sheet of synthetic aramid polyamide flame resistant fiber for absorbing heat energy.

16. The system of claim 12 in which each flame resistant shield comprises a sheet of synthetic aromatic polyimide flame resistant film for absorbing heat energy.

17. The system of claim 12 in which each flame resistant shield faces components mounted on the printed circuit board.

18. The system of claim 12 in which each flame resistant shield comprises a laminate structure.

19. The system of claim 18 in which the laminate structure includes an outer layer and an inner layer with an intermediate layer therebetween.

20. The system of claim 19 in which the outer layer and the inner layer comprise a polyamide sheet and the intermediate layer comprises a polyimide film.

21. The system of claim 19 in which the outer layer and the inner layer comprise a polyamide sheet and the intermediate layer comprises aluminum sheet metal.

22. A method for preventing fire spread through an electronic assembly including a plurality of adjacent printed circuit card assemblies, said method comprising:
  placing between and spaced from adjacent printed circuit card assemblies, each printed circuit card assembly including a printed circuit board with electronic components mounted thereon, a sacrificial flame resistant shield for absorbing heat energy from an adjacent printed circuit card assembly, and for reducing heat transfer to the printed circuit board.

23. The method of claim 22 in which each flame resistant shield comprises a sheet of synthetic aramid polyamide flame resistant fiber for absorbing heat energy.

24. The method of claim 22 in which each flame resistant shield comprises a sheet of synthetic aromatic polyimide flame resistant film for absorbing heat energy.

25. The method of claim 22 in which each flame resistant shield comprises a laminate structure.

26. The method of claim 25 in which the laminate structure includes an outer layer and an inner layer with an intermediate layer there between.

27. The method of claim 26 in which the outer layer and the inner layer comprise a polyamide sheet and the intermediate layer comprises a polyimide film.

28. The method of claim 26 in which the outer layer and the inner layer comprise a polyamide sheet and the intermediate layer comprises aluminum sheet metal.

\* \* \* \* \*